(12) United States Patent
Chen et al.

(10) Patent No.: US 11,991,830 B2
(45) Date of Patent: May 21, 2024

(54) FLEXIBLE CIRCUIT BOARD ASSEMBLY, DISPLAY ASSEMBLY AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Qizhong Chen, Beijing (CN); Bing Ji, Beijing (CN); Liang Gao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 258 days.

(21) Appl. No.: 17/629,586

(22) PCT Filed: Mar. 26, 2021

(86) PCT No.: PCT/CN2021/083382
§ 371 (c)(1),
(2) Date: Jan. 24, 2022

(87) PCT Pub. No.: WO2021/208707
PCT Pub. Date: Oct. 21, 2021

(65) Prior Publication Data
US 2022/0287183 A1 Sep. 8, 2022

(30) Foreign Application Priority Data

Apr. 14, 2020 (CN) .......................... 202010289070.9

(51) Int. Cl.
*H05K 1/02* (2006.01)
*H01L 21/78* (2006.01)
(Continued)

(52) U.S. Cl.
CPC ........... *H05K 1/189* (2013.01); *H05K 1/0218* (2013.01); *H05K 1/0256* (2013.01); *H05K 7/20954* (2013.01)

(58) Field of Classification Search
CPC ...... H05K 1/02; H05K 1/0216; H05K 1/0218; H05K 1/0237; H05K 1/0256; H05K 1/181;
(Continued)

(56) References Cited

U.S. PATENT DOCUMENTS

2003/0043563 A1* 3/2003 Igarashi ............... H05K 9/0043
361/800
2007/0012787 A1* 1/2007 Takahashi .......... G06K 19/0775
235/492
(Continued)

FOREIGN PATENT DOCUMENTS

CN 101471329 A 7/2009
CN 202799566 U 3/2013
(Continued)

OTHER PUBLICATIONS

CN202010289070.9 first office action.

*Primary Examiner* — Xiaoliang Chen
(74) *Attorney, Agent, or Firm* — IPro, PLLC

(57) ABSTRACT

Disclosed in embodiments of the present disclosure are a flexible circuit board assembly, a display assembly and a display device. The flexible circuit board assembly includes: a first flexible circuit board, including a component part, the component part being provided with components; and a first wave absorbing layer, disposed on the component part and configured to cover the components. The display assembly includes a display module and the flexible circuit board assembly; the display module includes a module body and a second binding part, and the second binding part is configured to be bent to a back surface of the module body; and the
(Continued)

first flexible circuit board is located on the back surface of the module body and includes a first binding part, and the first binding part is bound and connected to the second binding part of the display module.

18 Claims, 2 Drawing Sheets

(51) Int. Cl.
| | |
|---|---|
| *H01L 23/00* | (2006.01) |
| *H01L 23/06* | (2006.01) |
| *H01L 23/28* | (2006.01) |
| *H01L 23/29* | (2006.01) |
| *H01L 23/31* | (2006.01) |
| *H01L 23/538* | (2006.01) |
| *H01L 23/552* | (2006.01) |
| *H01L 23/66* | (2006.01) |
| *H05K 1/18* | (2006.01) |
| *H05K 7/20* | (2006.01) |
| *H05K 9/00* | (2006.01) |

(58) Field of Classification Search
CPC ...... H05K 1/189; H05K 7/20; H05K 7/20954; H05K 7/20963; H05K 9/00; H05K 9/009; H05K 9/0022; H05K 9/0024; H05K 9/0043; H05K 9/0045; H05K 9/0058; H05K 9/0083; H05K 9/0084; H01L 21/78; H01L 21/561; H01L 21/563; H01L 21/4814; H01L 21/4853; H01L 21/6835; H01L 23/00; H01L 23/06; H01L 23/28; H01L 23/29; H01L 23/31; H01L 23/66; H01L 23/284; H01L 23/295; H01L 23/538; H01L 23/552; H01L 23/3107; H01L 23/3121; H01L 23/3135; H01L 23/3157
USPC ........ 361/749, 760, 800, 818; 174/378, 388; 438/113, 126
See application file for complete search history.

(56) References Cited

U.S. PATENT DOCUMENTS

| | | | |
|---|---|---|---|
| 2007/0177289 A1* | 8/2007 | Shim | H01J 11/12 |
| | | | 359/885 |
| 2009/0166819 A1 | 7/2009 | Chen et al. | |
| 2010/0294559 A1* | 11/2010 | Izawa | H05K 9/0024 |
| | | | 156/60 |
| 2013/0014984 A1* | 1/2013 | Iida | H05K 1/0218 |
| | | | 174/388 |
| 2015/0119102 A1* | 4/2015 | Saji | H01L 23/5384 |
| | | | 455/550.1 |
| 2016/0133579 A1* | 5/2016 | Akiba | H01L 24/94 |
| | | | 257/659 |
| 2018/0090449 A1* | 3/2018 | Jeong | H01L 23/552 |
| 2018/0374913 A1* | 12/2018 | Aota | H10K 59/131 |
| 2019/0101714 A1* | 4/2019 | Kurashima | G02B 6/4277 |
| 2019/0143636 A1* | 5/2019 | Seo | B32B 15/14 |
| | | | 361/760 |
| 2019/0181192 A1* | 6/2019 | Xue | G02F 1/13338 |
| 2019/0266374 A1* | 8/2019 | Lee | G06F 1/1684 |
| 2019/0267301 A1* | 8/2019 | Yazaki | H05K 9/0075 |
| 2019/0274212 A1* | 9/2019 | Otsubo | H05K 1/0216 |
| 2019/0363055 A1* | 11/2019 | Yazaki | H01L 23/3121 |
| 2019/0378779 A1* | 12/2019 | Fujii | H01L 23/498 |
| 2020/0209387 A1* | 7/2020 | Yeon | G01S 15/04 |
| 2020/0211977 A1* | 7/2020 | Kim | H01L 21/6835 |
| 2020/0371627 A1 | 11/2020 | Luo et al. | |
| 2022/0007513 A1* | 1/2022 | Li | H04M 1/0266 |

FOREIGN PATENT DOCUMENTS

| | | |
|---|---|---|
| CN | 203457195 U | 2/2014 |
| CN | 105025694 A | 11/2015 |
| CN | 106298741 A | 1/2017 |
| CN | 205912425 U | 1/2017 |
| CN | 108762562 A | 11/2018 |
| CN | 109559640 A | 4/2019 |
| CN | 110600522 A | 12/2019 |
| CN | 111028682 A | 4/2020 |
| WO | 2018005425 A2 | 1/2018 |

* cited by examiner

FLEXIBLE CIRCUIT BOARD ASSEMBLY, DISPLAY ASSEMBLY AND DISPLAY DEVICE

CROSS REFERENCE TO RELATED APPLICATIONS

The present disclosure is a National Stage of International Application No. PCT/CN2021/083382, filed Mar. 26, 2021, which claims priority to Chinese Patent Application No. 202010289070.9, entitled "Flexible Circuit Board Assembly, Display Assembly and Display Device", and filed to the China National Intellectual Property Administration on Apr. 14, 2020, the entire contents of which are incorporated herein by reference.

FIELD

The present disclosure relates to the technical field of display, in particular to a flexible circuit board assembly, a display assembly and a display apparatus.

BACKGROUND

As a display component of electronic equipment, an OLED display apparatus has been widely used in various electronic products, and an OLED display panel is an important component in the display apparatus. A drive integrated circuit chip (Drive IC) and a main flexible printed circuit (MFPC) are used for the circuit drive of an OLED display module, are generally bound with the OLED display module, will generate electromagnetic interference signals in the working process, and will be affected by external electromagnetic interference at the same time, resulting in decreasing of the drive yield of the OLED display apparatus. Therefore, the electromagnetic signal protection problem of the MFPC and the Drive IC needs to be improved.

SUMMARY

Embodiments of the present disclosure provide a flexible circuit board assembly includes:
 a first flexible circuit board, including a device part provided with components; and
 a first wave absorbing layer, disposed on a side of the device part and configured to cover the components.
In some embodiments, the flexible circuit board assembly, further includes:
 a conductive fabric layer, disposed on a side of the first wave absorbing layer facing away from the first flexible circuit board, and configured to cover the first wave absorbing layer; where an edge of the conductive fabric layer are bonded to the first flexible circuit board.
In some embodiments, the first flexible circuit board further includes a leakage copper part; and the conductive fabric layer covers the leakage copper part and is electrically connected to the leakage copper part.
In some embodiments, the flexible circuit board assembly, further includes:
 a first insulating film layer, disposed between the first wave absorbing layer and the first flexible circuit board; where an edge of the first insulating film layer extends beyond an edge of the first wave absorbing layer and is bonded to the conductive fabric layer.
In some embodiments, in a direction parallel to the first insulating film layer, a gap exists between the conductive fabric layer and the components.

A display assembly includes a display module and the flexible circuit board assembly in any one of the above embodiments;
 the display module includes a module body and a second binding part located at one side edge of the module body, and the second binding part is configured to be bent to a back surface of the module body; and
 the first flexible circuit board is disposed on the back surface of the module body and includes a first binding part, and the first binding part is bound with the second binding part.
In some embodiments, the display assembly further includes:
 an integrated circuit chip, disposed on a side of the second binding part facing away from the module body; and
 a second wave absorbing layer, disposed between the module body and the second binding part bent to the back surface of the module body; an orthographic projection of the integrated circuit chip on the second binding part is in an orthographic projection of the second wave absorbing layer on the second binding part.
In some embodiments, the display assembly further includes:
 a conductive adhesive layer, disposed between the module body and the second binding part, the orthographic projection of the integrated circuit chip on the second binding part is within an orthographic projection of the conductive adhesive layer on the second binding part.
In some embodiments, the orthographic projection of the second wave absorbing layer on the second binding part is within the orthographic projection of the conductive adhesive layer on the second binding part.
In some embodiments, the second wave absorbing layer is embedded in the conductive adhesive layer.
In some embodiments, the second wave absorbing layer is embedded in a side of the conductive adhesive layer facing the second binding part, and a side surface of the second wave absorbing layer facing the second binding part is flush with a side surface of a part, which is not embedded by the second wave absorbing layer, of the conductive adhesive layer facing the second binding part.
In some embodiments, the module body includes a display panel and a heat dissipation metal layer; the heat dissipation metal layer is disposed on a side of the display panel facing the second binding part; and
 a side face of the conductive adhesive layer facing away from the integrated circuit chip is bonded to the heat dissipation metal layer.
In some embodiments, the display assembly further includes:
 a second insulating film layer, disposed between the conductive adhesive layer and the second binding part bent to the back surface of the module body, the orthographic projection of the conductive adhesive layer on the second binding part is within an orthographic projection of the second insulating film layer on the second binding part.
In some embodiments, the display module includes a display panel, and a part, extending beyond the module body, of the display panel is configured as the second binding part.
In some embodiments, the display module includes a display panel and a second flexible circuit board with one end bound with the display panel, and the second flexible circuit board is configured to be partially bent to the back surface of the module body to form the second binding part.

A display apparatus, includes the display assembly in any one of the above embodiments.

DETAILED DESCRIPTION OF THE EMBODIMENTS

The technical solutions of embodiments of the present disclosure will be described clearly and completely with reference to the accompanying drawings of embodiments of the present disclosure. Apparently, the described embodiments are some, but not all, embodiments of the present disclosure. Based on embodiments of the present disclosure, all other embodiments attainable by those ordinarily skilled in the art without involving any inventive effort are within the protection scope of the present disclosure.

Figure 1:
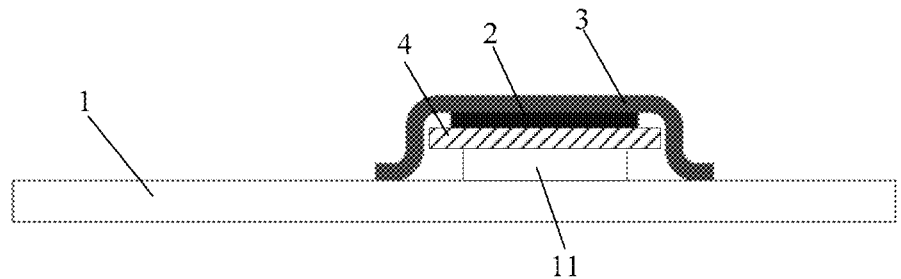
FIG. 1 is a schematic structural diagram of a partial cross section of a flexible circuit board assembly, provided by an embodiment of the present disclosure.
Figure 2:
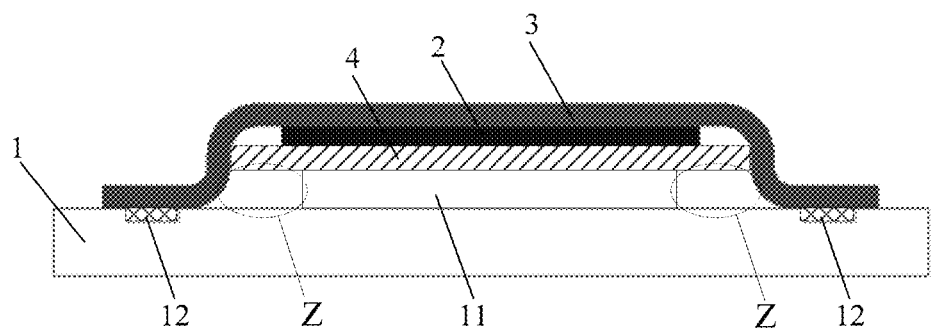
FIG. 2 is a schematic structural diagram of a partial cross section of a flexible circuit board assembly, provided by another embodiment of the present disclosure.

As shown in FIG. 1 and FIG. 2, an embodiment of the present disclosure provides a flexible circuit board assembly, including:
a first flexible circuit board 1, including a device part provided with components 11; and
a first wave absorbing layer 2, disposed on a side of the device part and configured to cover the components 11.

In some embodiments, a device part of a conventional flexible circuit board is generally provided with an integrated circuit chip (IC), a capacitor and other components. For example, a device part of a main control flexible printed circuit (MFPC) generally includes a touch integrated circuit chip (Touch-IC) and a capacitor. In some embodiments, the components 11 may include the touch integrated circuit chip (Touch-IC) and the capacitor. The inventor found that the IC on the flexible circuit board will generate electromagnetic interference signals in the working process, and at the same time will be subjected to external electromagnetic interference, and the capacitor on the flexible circuit board mainly exists between a power line and a ground wire and also generates electromagnetic interference signals. However, at present, there is no relevant electromagnetic shielding and protection scheme for these components on the FPC.

In the flexible circuit board assembly provided by embodiments of the present disclosure, the first wave absorbing layer 2 is disposed on the device part of the first flexible circuit board 1, the first wave absorbing layer 2 covers the components 11 on the device part and may absorb electromagnetic signals in a region of the device part, and at the same time, the components 11 (such as Touch-IC) of the device part are prevented from external electromagnetic interference, the electromagnetic shielding function of the device part is increased, and the electromagnetic protection effect of the components 11 on the flexible circuit board is achieved.

In some embodiments, a wave absorbing material refers to a type of material that can absorb or greatly reduce electromagnetic wave energy projected on its surface so as to reduce electromagnetic wave interference. Exemplarily, the first wave absorbing layer in the present disclosure may be a solid powder material layer coagulated by a colloid. In some embodiments, the solid powder may be iron oxide powder or magnetic iron nano powder.

Exemplarily, a film layer shape of the first wave absorbing layer 2 may be similar to a shape of the device part, and the first wave absorbing layer 2 is configured to completely cover the device part.

As shown in FIG. 1 and FIG. 2, in some embodiments, the flexible circuit board assembly provided by the present disclosure may further include a conductive fabric layer 3, the conductive fabric layer 3 is disposed on a side of the first wave absorbing layer 2 facing away from the first flexible circuit board 1, and configured to cover the first wave absorbing layer 2, and an edge of the conductive fabric layer 3 is bonded to the first flexible circuit board 1.

Conductive fabric is a structural layer in which fibers are pre-treated with an electroplated metal plating so as to have metallic characteristics.

In some embodiments, the conductive fabric layer 3 covers the first wave absorbing layer 2 and the components 11, and can be bonded on the first flexible circuit board 1, thereby wrapping the components 11 of the device part and the first wave absorbing layer 2. On the one hand, a closed electromagnetic shielding environment may be formed, and electromagnetic interference signals are effectively shielded. On the other hand, some powder particles disengaged from the first wave absorbing layer 2 can be prevented from adversely affecting the first flexible circuit board 1.

As shown in FIG. 2, in some embodiments, the first flexible circuit board 1 further includes a leakage copper part 12; and the conductive fabric layer 3 covers the leakage copper part 12 and is electrically connected to the leakage copper part 12.

In some embodiments, the conductive fabric layer 3 extends to the leakage copper part 12 of the first flexible circuit board 1, and is bonded with the leakage copper part 12 to achieve electrical connection, thereby forming grounding, so that static electricity of the device part can be timely released, the electrostatic treatment of the device part is improved, and parasitic capacitance is prevented from being generated due to the conductive fabric layer 3.

As shown in FIG. 1 and FIG. 2, in some embodiments, the flexible circuit board assembly provided by the present disclosure may further include a first insulating film layer 4, and the first insulating film layer 4 is disposed between the first wave absorbing layer 2 and the first flexible circuit board 1.

Exemplarily, as shown in FIG. 2, an edge of the first insulating film layer 4 extends beyond an edge of the first wave absorbing layer 2 and is bonded to the conductive fabric layer 3.

The first insulating film layer 4 is a film layer with electrical insulation, good flexibility, and good waterproof performance, and may be a polyester film material, such as Mylar.

In some embodiments, the first insulating film layer 4 is disposed between the conductive fabric layer 3 and the components 11, and can prevent the conductive fabric layer 3 from being directly bonded to the components 11 and avoid the adverse risk caused by electrostatic discharge (ESD) of the conductive fabric layer 3. In addition, the first insulating film layer 4 and the conductive fabric layer 3 are respectively located on both sides of the first wave absorbing layer 2, and an outer dimension of the first insulating film layer 4 is larger than an outer dimension of the first wave absorbing layer 2, a part, extending beyond the first wave absorbing layer 2, of the first insulating film layer 4 will be directly attached to the conductive fabric layer 3, thereby fully wrapping the first wave absorbing layer 2, so that some powder particles disengaged from the first wave absorbing layer 2 are further prevented from adversely affecting the first flexible circuit board 1.

Exemplarily, as shown in FIG. 2, in a direction parallel to the first insulating film layer 4, a gap Z exists between the conductive fabric layer 3 and the components 11 to prevent the conductive fabric layer 3 from being directly bonded to the components 11, and avoid the adverse risk caused by electrostatic discharge (ESD) of the conductive fabric layer 3.

Embodiments of the present disclosure further provide a display assembly. The display assembly includes a display module and the flexible circuit board assembly described in any one of the above embodiments.

Figure 3:
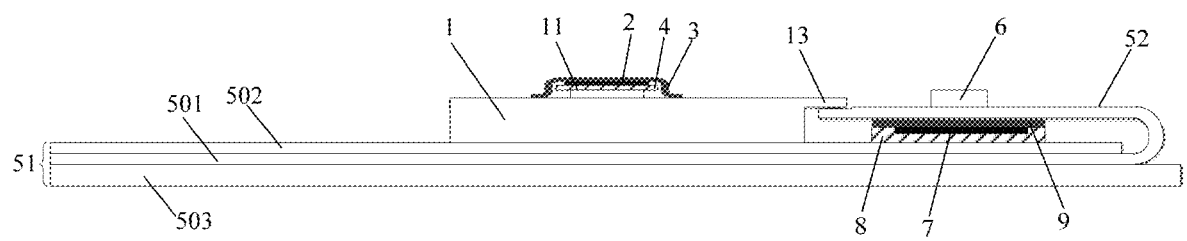
FIG. 3 is a schematic structural diagram of a cross section of a display assembly, provided by an embodiment of the present disclosure.
Figure 4:
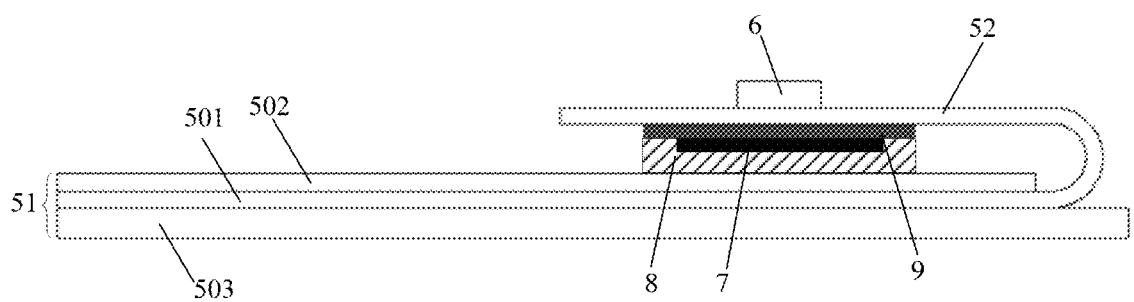
FIG. 4 is a schematic structural diagram of a partial cross section of a display assembly, provided by an embodiment of the present disclosure.

In some embodiments, as shown in FIG. 3 and FIG. 4, the display module has a module body 51 and a second binding part 52 disposed at one side edge of the module body 51, and the second binding part 52 is configured to be bent to a back surface of the module body 51.

In some embodiments, as shown in FIG. 3, the first flexible circuit board 1 is disposed on the back surface of the module body 51, and has a first binding part 13, and the first binding part 13 is bound with the second binding part 52 of the display module. The first flexible circuit board 1 is configured as a main control flexible printed circuit (MEPC) of the display module. The components 11 on the first flexible circuit board 1 are disposed on a side of a circuit board body facing away from the module body 51; and the conductive fabric layer 3, the first wave absorbing layer 2 and the first insulating film layer 4 are disposed on a side of the first flexible circuit board 1 facing away from the module body 51.

As shown in FIG. 3 and FIG. 4, in some embodiments, the display assembly provided by the present disclosure further includes an integrated circuit chip 6, and the integrated circuit chip 6 is disposed on the second binding part and disposed on a side of the second binding part 52 facing away from the module body 51. In some embodiments, the integrated circuit chip 6 is a drive chip (Drive IC) of the display module, and is directly bound to the second binding part 52 of the display module.

Further, the display assembly provided by the present disclosure may further include a second wave absorbing layer 7, the second wave absorbing layer 7 is disposed between the module body 51 and the second binding part 52 bent to the back surface of the module body 51, and an orthographic projection of the integrated circuit chip (Drive IC) 6 on the second binding part 52 is in an orthographic projection of the second wave absorbing layer 7 on the second binding part 52.

In some embodiments, the second wave absorbing layer 7 is disposed between the integrated circuit chip (Drive IC) 6 and the module body 51, which can absorb electromagnetic signals in a lower region of the Drive IC 6, increase the electromagnetic shielding function of the lower region of the Drive IC 6, and prevent the Drive IC 6 from being electromagnetically interfered by the module body 51 at the same time.

As shown in FIG. 3 and FIG. 4, in some embodiments, the display component provided by the present disclosure may further include a conductive adhesive layer 8, the conductive adhesive layer 8 is disposed between the module body 51 and the second binding part 52, and the orthographic projection of the integrated circuit chip (Drive IC) 6 on the second binding part 52 is in an orthographic projection of the conductive adhesive layer 8 on the second binding part 52.

In some embodiments, a conductive adhesive is an adhesive that has certain conductivity after being cured or dried. The conductive adhesive layer in the present disclosure may have properties such as high temperature resistance and instant curing.

Exemplarily, the orthographic projection of the second wave absorbing layer 7 on the second binding part 52 is also located within the orthographic projection of the conductive adhesive layer 8 on the second binding part 52.

In some embodiments, on one hand, the conductive adhesive layer 8 may reflect electromagnetic signals in the lower region of the Drive IC 6 to enhance the electromagnetic shielding function of the lower region of the Drive IC 6. On the other hand, the conductive adhesive layer 8 may be attached to the second wave absorbing layer 7 so as to prevent some powder particles from being disengaged from the second wave absorbing layer 7 to adversely affect the display assembly.

As shown in FIG. 3 and FIG. 4, in some embodiments, the second wave absorbing layer 7 is embedded in the conductive adhesive layer 8.

In some embodiments, the second wave absorbing layer 7 is embedded in a side of the conductive adhesive layer 8 facing the second binding part 52, and a side surface of the second wave absorbing layer 7 facing the second binding part 52 is flush with a side surface of a part, which is not embedded by the second wave absorbing layer 7, of the conductive adhesive layer 8 facing the second binding part 52. In this way, the conductive adhesive layer 8 may wrap the first wave absorbing layer 2 to prevent powder particles from being disengaged from the first wave absorbing layer 2 to adversely affect the display assembly. In addition, the surface of the second wave absorbing layer 7 is flush with the surface of the conductive adhesive layer 8, which can provide a flat supporting surface for the second binding part 52, and prevent the surface of the second binding part 52 from being raised or wrinkled due to uneven force.

As shown in FIG. 3 and FIG. 4, in some embodiments, the module body 51 includes a display panel 501 and a heat dissipation metal layer 502; and the heat dissipation metal layer 502 is disposed on a side of the display panel 501 facing the second binding part 52.

In some embodiments, the conductive adhesive layer 8 is bonded to the heat dissipation metal layer 502.

In some embodiments, the heat dissipation metal layer 502 may be copper foil.

A side face of the conductive adhesive layer 8 facing away from the integrated circuit chip 6 is bonded to the heat dissipation metal layer 502, thereby achieving grounding, so that the electrostatic treatment of the lower region of the Drive IC 6 is improved and bad effects caused by parasitic capacitance generated by the conductive adhesive layer 8 are prevented.

As shown in FIG. 3 and FIG. 4, in some embodiments, the display assembly provided by the present disclosure may further include a second insulating film layer 9. The second insulating film layer 9 is disposed on the conductive adhesive layer 8 and the second binding part 52 bent to the back surface of the module body 51, and the orthographic projection of the conductive adhesive layer 8 on the second binding part 52 is located within an orthographic projection of the second insulating film layer 9 on the second binding part 52.

In some embodiments, the second insulating film layer 9 is disposed between the conductive adhesive layer 8 and the second binding part 52, which can prevent the conductive adhesive layer 8 from being directly bonded to the second binding part 52 under the Drive IC 6, and avoid risks caused by electrostatic discharge (ESD) of the conductive adhesive layer 8. In addition, the second insulating film layer 9 is bonded to the conductive adhesive layer 8, so that the second wave absorbing layer 7 embedded in the conductive adhesive layer 8 can be fully wrapped, which can further prevent some powder particles disengaged from the second wave absorbing layer 7 from adversely affecting the first flexible circuit board 1.

In some embodiments, a material of the second wave absorbing layer may be the same as a material of the first wave absorbing layer; and a material of the second insulating film layer may be the same as a material of the first insulating film layer, which will not be repeated here.

In some embodiments, as shown in FIG. 3 and FIG. 4, in the display assembly provided by the present disclosure, the display module includes a display panel 501, and a part, extending beyond the module body 51, of the display panel 501 is configured as the second binding part 52. That is, the display panel 501 is a flexible display panel, and the part that extends beyond the module body 51 may be bent to the back surface of the module body 51 to form the second binding part 52.

In some embodiments, the display module further includes a display panel and a second flexible circuit board with one end bound and connected to the display panel, and the second flexible circuit board is configured to be partially bent to the back surface of the module body to form the second binding part. At this time, the display panel may be a rigid panel, and the second flexible circuit board may be bent to the back surface of the module body to form the second binding part.

In some embodiments, in the display assembly provided by embodiments of the present disclosure, the display panel may be an AMOLED panel.

In some embodiments, as shown in FIG. 3 and FIG. 4, in the display assembly provided by embodiments of the present disclosure, the display module may include the display panel 501 and the heat dissipation metal layer 502, and may also include a glass cover plate 503 located on a light-out side of the display panel 501, a polarizer (not shown in the figure) and other structures, which are not repeated here.

In addition, the present disclosure also provides a display apparatus. The display apparatus includes the display assembly described in any one of the above embodiments.

In some embodiments, the display apparatus may be an OLED display apparatus, which may be applied to display apparatuses such as tablet computers and mobile phones.

It should be noted that in some embodiments of the present disclosure, the display assembly and the display apparatus may also include other structures, which may be determined according to actual requirements, and embodiments of the present disclosure do not limit this. In addition, the size and material selection of the wave absorbing material, the insulating film layers, the conductive fabric, the conductive adhesive and other layer structures provided by embodiments of the present disclosure are not limited to the above embodiments, and for basic requirements, please refer to the above description, which is not repeated here. Furthermore, the drawings of the present disclosure are only schematic diagrams, and the size and ratio of each part of the structure in the figures do not represent the actual size and ratio of each structure.

It will be apparent to those skilled in the art that various modifications and variations can be made in embodiments of the present disclosure without departing from the spirit or scope of the present disclosure. Thus, if these modifications and variations of the present disclosure fall within the scope of the claims of the present disclosure and its equivalent technology, the present disclosure is also intended to include these modifications and variations.

What is claimed is:

1. A flexible circuit board assembly, comprising:
    a first flexible circuit board, comprising a device part provided with components;
    a first wave absorbing layer, disposed on a side of the device part and configured to cover the components; and
    a conductive fabric layer, disposed on a side of the first wave absorbing layer facing away from the first flexible circuit board, and configured to cover the first wave absorbing layer;
    wherein an edge of the conductive fabric layer are bonded to the first flexible circuit board.

2. The flexible circuit board assembly according to claim 1, wherein the first flexible circuit board further comprises a leakage copper part; and
    the conductive fabric layer covers the leakage copper part and is electrically connected to the leakage copper part.

3. The flexible circuit board assembly according to claim 1, further comprising:
    a first insulating film layer, disposed between the first wave absorbing layer and the first flexible circuit board;
    wherein an edge of the first insulating film layer extends beyond an edge of the first wave absorbing layer and is bonded to the conductive fabric layer.

4. The flexible circuit board assembly according to claim 3, wherein in a direction parallel to the first insulating film layer, a gap exists between the conductive fabric layer and the components.

5. A display assembly, comprising:
    a display module; and
    the flexible circuit board assembly according to claim 1, wherein
    the display module comprises a module body and a second binding part located at one side edge of the module body, and the second binding part is configured to be bent to a back surface of the module body; and
    the first flexible circuit board is disposed on the back surface of the module body and comprises a first binding part, and the first binding part is bound with the second binding part.

6. The display assembly according to claim 5, further comprising:
    an integrated circuit chip, disposed on a side of the second binding part facing away from the module body; and
    a second wave absorbing layer, disposed between the module body and the second binding part bent to the back surface of the module body;
    wherein an orthographic projection of the integrated circuit chip on the second binding part is within an orthographic projection of the second wave absorbing layer on the second binding part.

7. The display assembly according to claim 6, further comprising:
    a conductive adhesive layer, disposed between the module body and the second binding part;

wherein the orthographic projection of the integrated circuit chip on the second binding part is within an orthographic projection of the conductive adhesive layer on the second binding part.

8. The display assembly according to claim 7, wherein the orthographic projection of the second wave absorbing layer on the second binding part is within the orthographic projection of the conductive adhesive layer on the second binding part.

9. The display assembly according to claim 8, wherein the second wave absorbing layer is embedded in the conductive adhesive layer.

10. The display assembly according to claim 9, wherein:
the second wave absorbing layer is embedded in a side of the conductive adhesive layer facing the second binding part; and
a side surface of the second wave absorbing layer facing the second binding part is flush with a side surface of a part, which is not embedded by the second wave absorbing layer, of the conductive adhesive layer facing the second binding part.

11. The display assembly according to claim 7, wherein the module body comprises a display panel and a heat dissipation metal layer;
the heat dissipation metal layer is disposed on a side of the display panel facing the second binding part; and
a side face of the conductive adhesive layer facing away from the integrated circuit chip is bonded to the heat dissipation metal layer.

12. The display assembly according to claim 7, further comprising:
a second insulating film layer, disposed between the conductive adhesive layer and the second binding part bent to the back surface of the module body;
wherein the orthographic projection of the conductive adhesive layer on the second binding part is within an orthographic projection of the second insulating film layer on the second binding part.

13. The display assembly according to claim 5, wherein the display module comprises a display panel; and
a part, extending beyond the module body, of the display panel is configured as the second binding part.

14. The display assembly according to claim 5, wherein the display module comprises:
a display panel; and
a second flexible circuit board with one end bound with the display panel;
wherein the second flexible circuit board is configured to be partially bent to the back surface of the module body to form the second binding part.

15. A display apparatus, comprising the display assembly according to claim 5.

16. The flexible circuit board assembly according to claim 2, further comprising:
a first insulating film layer, disposed between the first wave absorbing layer and the first flexible circuit board;
wherein an edge of the first insulating film layer extends beyond an edge of the first wave absorbing layer and is bonded to the conductive fabric layer.

17. The display assembly according to claim 5, wherein the first flexible circuit board further comprises a leakage copper part; and
the conductive fabric layer covers the leakage copper part and is electrically connected to the leakage copper part.

18. The display assembly according to claim 5, wherein the flexible circuit board assembly further comprises:
a first insulating film layer, disposed between the first wave absorbing layer and the first flexible circuit board;
wherein an edge of the first insulating film layer extends beyond an edge of the first wave absorbing layer and is bonded to the conductive fabric layer.

* * * * *